United States Patent [19]

Reed et al.

[11] Patent Number: 4,927,704

[45] Date of Patent: May 22, 1990

[54] ABRASION-RESISTANT PLASTIC ARTICLES AND METHOD FOR MAKING THEM

[75] Inventors: Clive W. Reed, Scotia; Stefan J. Rzad, Rexford; John C. Devins, Burnt Hills, all of N.Y.

[73] Assignee: General Electric Company, Schenectady, N.Y.

[21] Appl. No.: 336,277

[22] Filed: Apr. 11, 1989

[51] Int. Cl.$^5$ .............................................. B05D 3/06
[52] U.S. Cl. ........................ 428/221; 427/38; 427/44; 427/255.3; 427/255.6; 427/255.7; 428/447; 428/698; 428/702; 428/704
[58] Field of Search ........... 427/38, 255.3, 44, 255.6, 427/255.7; 428/221, 447, 698, 702, 704

[56] References Cited

U.S. PATENT DOCUMENTS

| | | | |
|---|---|---|---|
| 3,713,869 | 1/1973 | Geffcken et al. | 204/165 X |
| 4,096,315 | 6/1978 | Kubacki | 428/412 |
| 4,137,365 | 1/1979 | Wydeven et al. | 428/412 |
| 4,190,681 | 2/1980 | Hall et al. | 427/45.1 |
| 4,200,681 | 4/1980 | Hall et al. | 427/45.1 X |
| 4,260,647 | 4/1981 | Wang et al. | 427/40 |
| 4,328,646 | 5/1982 | Kaganowicz | 51/281 R |
| 4,352,836 | 10/1982 | Robinson et al. | 427/39 |
| 4,419,404 | 12/1983 | Arai et al. | 428/336 |
| 4,568,563 | 2/1986 | Jackson et al. | 427/40 |
| 4,594,079 | 6/1986 | Yamamoto et al. | 55/158 |

OTHER PUBLICATIONS

D. W. Hess, J. Vac. Sci. Technol., Apr.–Jun. 1984, "Plasma-Enhanced CVD: Oxides, Nitrides, Transition Metals, and Transition Metal Silicides", pp. 244–252.

J. L. Vossen, J. Electrochem. Soc., Feb. 1979, vol. 126, No. 2, "Glow Discharge Phenomena in Plasma Etching and Plasma Deposition", pp. 319–324.

*Primary Examiner*—Bernard Pianalto
*Attorney, Agent, or Firm*—William H. Pittman; James C. Davis, Jr.

[57] ABSTRACT

An abrasion-resistant article and method for making is disclosed. The article includes a plastic substrate and a gradational coating applied by plasma-enhanced chemical vapor deposition to the surface thereof.

23 Claims, No Drawings

ABRASION-RESISTANT PLASTIC ARTICLES AND METHOD FOR MAKING THEM

BACKGROUND OF THE INVENTION

This invention relates generally to plastic articles, and more particularly to polycarbonate articles exhibiting improved abrasion resistance, together with improved resistance to cracking under exposure to thermal and mechanical stresses.

Engineering resins are well-known, commercially available materials possessing physical and chemical properties which are useful in a wide variety of applications. For example, polycarbonates, because of their excellent breakage resistance, have replaced glass in many products, such as automobile headlamps and stoplight lenses; safety shields in windows, architectural glazing, and the like. However, major defects exhibited by polycarbonates are their very low scratch-resistance and their susceptibility to ultraviolet light-induced degradation.

Methods for improving the scratch-resistance of plastics such as polycarbonate have involved disposing an inorganic protective layer on the surface of the polycarbonate. For example, in U.S. Pat. No. 4,328,646, issued to Kaganowicz, an abrasion-resistant article is formed by subjecting a mixture of hardcoating precursors to a glow discharge, and depositing the product directly on a plastic substrate as a very thin film. However, inorganic hardcoatings such as silicon dioxide ($SiO_2$) deposited directly onto plastics such as polycarbonate have performance problems when the system is subjected to stresses produced by mechanical or thermal effects. These problems are due to the difference in property characteristics of inorganic and plastic materials. For example, the thermal expansion coefficient for polycarbonate is about $7 \times 10^{-5}$ m/m/° C., while the coefficient for Pyrex ® glass is $3 \times 10^{-6}$ m/m/° C. These differences result in tangential stresses at the interface of the plastic and the hardcoating which may in turn cause cracking of the hardcoating as a stress relief mechanism, especially when the article is subjected to various heating/cooling cycles. In attempting to alleviate this problem, Hall et al. and Geffcken et al. in U.S. Pat. Nos. 4,190,681 and 3,713,869, respectively, proposed the use of an intermediate layer to improve adhesion between the hard inorganic layer and the plastic layer. Furthermore, in Attorney Docket RD-16563 (Ser. No. 034,890), filed Apr. 6, 1987 for Devins et al. and assigned to the assignee of the present invention, there is disclosed an intermediate layer which not only improves adhesion but also provides a transition in properties from the plastic to the inorganic hardcoating, thus resulting in improved mechanical and thermal performance.

There is a continuing interest in improving methods for forming articles having still greater abrasion resistance while also exhibiting improvements in various other physical properties.

It is therefore an object of the present invention to provide a method for forming plastic articles having a high level of abrasion resistance, with improved resistance to cracking under exposure to thermal and mechanical stresses.

It is another object of the present invention to provide an improved method for applying smooth, hard, transparent layers over a thermoplastic substrate.

It is yet another object of the present invention to provide a thermoplastic article having disposed thereover a protective top layer characterized by uniform thickness, high abrasion resistance, and freedom from pinholes and microcracks.

SUMMARY OF THE INVENTION

An improved method for forming an abrasion-resistant plastic article has been discovered, comprising the plasma-enhanced chemical vapor deposition of a coating characterized by a gradual transition from a composition consisting essentially of an interfacial material to a composition consisting essentially of an abrasion-resistant material. The transition is achieved by gradually changing the feed composition of the coating material precursors, as described below.

Several different types of interfacial material may be used, as further described below. Furthermore, many different abrasion-resistant materials capable of being applied by plasma-enhanced chemical vapor deposition (PECVD) may be used. "Interfacial" is meant herein to describe a material situated between the substrate and the abrasionresistant material and possessing some chemical characteristics in common with each, as described in detail below.

Use of the method of the present invention for plastic articles such as polycarbonates results in articles having all of the typical attributes of polycarbonates, such as high tensile and impact strength, while also exhibiting excellent abrasion resistance. Furthermore, good adhesion generally results between the polycarbonate substrate and the coating formed thereon, which is also referred to herein as a "gradational layer".

A further attribute of this method is that PECVD may be carried out as disclosed herein at temperatures which are harmless to polycarbonate, in contrast to conventional chemical vapor deposition (CVD) processes which require high operating temperatures often damaging to polycarbonate material. "Conventional" vapor deposition processes as used herein denotes both CVD processes in which coating material precursors react in the gas phase at elevated temperatures, typically above 400° C.; and also denotes "physical vapor deposition" processes in which preformed coating materials are simply evaporated onto a substrate. These processes do not involve the use of a plasma.

The scope of the present invention also includes an article comprising a plastic substrate and an abrasionresistant gradational layer disposed thereon which consists essentially of an interfacial material at a depth closest to the surface of the substrate, the relative concentration of the interfacial material gradually decreasing in a direction perpendicular to the substrate surface and being replaced by a corresponding concentration of an abrasion-resistant material.

DETAILED DESCRIPTION OF THE INVENTION

The article formed by the method of the present invention may include any plastic material as a substrate. Illustrative plastics include acrylic, polyester, polyethylene, polyimide, polyphenylene oxide, polycarbonate, polyamide, epoxy, phenolic, acrylonitrile-butadiene-styrene, and acetal. Blends of these materials as well as blends with other materials such as impact modifiers are also possible. Furthermore, the substrates may contain various additives such as UV absorbers, fillers, plasticizers, and the like.

Where transparency is required, the preferred substrate is formed of polycarbonate or an acrylic resin such as poly(methyl methacrylate). Polycarbonates are especially preferred materials for transparent substrates because of their excellent physical, mechanical and chemical properties. In general, the choice of substrate is ultimately determined by the end use contemplated for the article.

Polycarbonates suitable for forming such a substrate are well-known in the art and are described, for example, in U.S. Pat. Nos. 4,200,681 and 4,210,699, both incorporated herein by reference, and in RD-16563 (Devins et al., Ser. No. 034,890, filed Apr. 6, 1987), the contents of which are also incorporated herein by reference. Such polycarbonates generally comprise repeating units of the formula

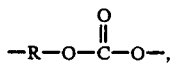

in which R is a divalent radical of a dihydric phenol, e.g., a radical of 2,2-bis(4-hydroxyphenyl)-propane, also known as bisphenol A,

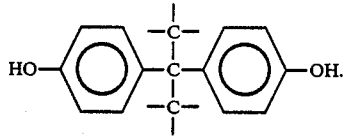

Polycarbonates within the scope of the present invention may be prepared by several well-known methods. For example, preparation may be accomplished by reacting a dihydric phenol with a carbonate precursor. A wide variety of dihydric phenols, such as bisphenol A, may be used in the present invention; many are disclosed in U.S. Pat. Nos. 2,999,835; 3,082,365; 3,160,121; 3,334,154; and 4,190,681, all incorporated herein by reference. Many carbonate precursors may be used; they are typically either a carbonyl halide, a carbonate ester, or a haloformate. Exemplary carbonate precursors are described in U.S. Pat. No. 4,190,681.

The term "polycarbonate" is meant herein to additionally include polymer blends of polycarbonates with various other materials such as polyesters and impact modifiers.

The substrate may be shaped into a variety of forms, depending on the end use contemplated for the articles. For example, a polycarbonate film substrate may be formed by casting the molten polymer onto a flat open mold, and then pressing the material to a uniform thickness. After cooling, the film may then have a gradational layer applied thereover, as further described below. Furthermore, the substrate may be in the form of tubes, rods, or irregular shapes. When the article of the present invention is to be used as a glazing material, a polycarbonate material may be formed into flat or curved sheets by well-known methods, e.g., extrusion, injection molding, or thermoforming.

As mentioned above, the gradational layer which is applied over the surface of a substrate according to the method of the present invention is formed substantially of an interfacial material at a depth closest to the surface of the substrate. For the purpose of clarification, the region of the gradational layer containing at least about 99% by weight interfacial material will sometimes be referred to herein as the "interfacial sublayer", while the region above the gradational sublayer containing more than about 99% by weight of an abrasion-resistant material will sometimes be referred to herein as the "abrasion-resistant sublayer". Furthermore, the region between the interfacial sublayer and the abrasion-resistant sublayer will sometimes be referred to as the "gradational sublayer". The thickness of each layer is determined by process conditions, e.g., changes made in the gaseous reactant feed into the PECVD reactor. Thus, the depth of each sublayer is predetermined by the intended requirements for the particular abrasion-resistant article. For example, the abrasion-resistant sublayer may constitute a larger portion of the gradational layer when greater abrasion resistance is required.

The composition of the plasma-applied interfacial material of the present invention depends on the end use contemplated for the article. Organosilicons are particularly useful for forming the interfacial material, especially when the abrasion-resistant material is silicon dioxide. "Organosilicon" as used herein is meant to embrace organic compounds in which at least one silicon atom is bonded to at least one carbon atom, and includes silicone materials, as well as materials commonly referred to as silanes, siloxanes, silazanes, and organosilicones. Many of the organosilicons suitable for the method and article of the present invention are described in *Organosilicon Compounds*, C. Eaborn, Butterworths Scientific Publications, 1960. Other suitable organosilicon compounds are described in *Organic Polymer Chemistry*, K. Saunders, Chapman and Hall Ltd., 1973.

Non-limiting examples of organosilicon compositions useful for the present invention are compounds represented by the general formula

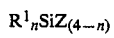

wherein $R^1$ represents a monovalent hydrocarbon radical or a halogenated monovalent hydrocarbon radical, Z represents a hydrolyzable group, and n may vary between 0 and 2. More specifically, Z is preferably a member such as halogen, alkoxy, acyloxy, or aryloxy. Such compounds are well-known in the art and are described, for example, in S. Schroeter et al.'s U.S. Pat. No. 224,378, incorporated herein by reference.

Other exemplary organosilicons falling within the scope of the present invention include silanols having the formula

wherein $R^2$ is selected from the group consisting of alkyl radicals containing from about 1 to about 3 carbon atoms, the vinyl radical, the 3,3,3-trifluoropropyl radical, the gamma-glycidoxypropyl radical and the gamma-methacryloxypropyl radical, with at least about 70% by weight of the silanol being $CH_3Si(OH)_3$. Such compounds are described in U.S. Pat. No. 4,242,381 incorporated herein by reference.

Preferred organosilicon compounds of the present invention are hexamethyldisilazane, hexamethyldisiloxane, vinyltrimethylsilane and octamethylcyclotetrasiloxane.

When abrasion-resistant materials other than those containing silicon are to be employed, other classes of interfacial materials, such as various organometallics, would be appropriate. For example, titanium isopropoxide, Ti₄(O₃H₇), could be a suitable interfacial material when titanium dioxide is to be the abrasion-resistant material.

The interfacial material may alternatively comprise plasma-polymerized acrylic materials. For example, an acrylic acid ester monomer or methacrylic acid ester monomer may be vaporized and then plasma-polymerized to form a polymeric coating which is deposited on the underlying coating surface. Many of these materials are generally described in the application of Devins et al., Ser. No. 034,890; in the *Encyclopedia of Polymer Science and Technology*, Volume I, Interscience Publishers, John Wiley and Sons, Inc., 1964, and in *Chemistry of Organic Film Formers*, by D. Solomon, John Wiley and Sons, Inc., 1967, as well as references cited in each of the texts. Other exemplary acrylic materials are described in U.S. Pat. Nos. 4,239,798 and in 4,242,383, both incorporated herein by reference.

The interfacial material may alternatively be a polyolefin. Nonlimiting examples of suitable polyolefins include polyethylene, polypropylene, polyisoprene, and copolymers of these types of materials. Further included within the broad definition of polyolefin as used herein are synthetic and natural elastomers, many of which are described in the *Encyclopedia of Polymer Science and Technology*, Vol. 5, pp. 406–482 (1966), the disclosure of which is incorporated by reference herein. Many of these materials can be deposited according to the present invention by vaporizing and then plasma-polymerizing their monomer precursors under the plasma conditions described below.

Nonlimiting examples of compounds suitable for the abrasion-resistant material include silicon dioxide, silicon nitride, silicon oxynitride, silicon carbide, silicon carbonitride, boron oxide, boron nitride, aluminum oxide, aluminum nitride, titanium dioxide, tantalum oxide, iron oxide, germanium oxide, and germanium carbide. Mixtures of such materials are also possible. When the article is to be used as a glazing material, a silicon dioxide top layer is preferred because of its ease of plasma deposition, its excellent transparency, and the relatively inexpensive cost of its precursors. It should be understood that "precursor" as used herein is meant to include either one precursor or more than one precursor, depending on the particular materials being used.

A primer may be applied to the surface of the substrate prior to the application of the gradational layer. The primer may be applied by conventional methods well-known in the art, e.g., spraying, roll coating, curtain coating, dip coating, brushing, and other art-recognized techniques. This layer tends to increase the adhesion of the interfacial material to the substrate surface, while also acting as an incorporation site for one or more ultraviolet light (UV) absorbers. The primer material generally exhibits some compositional differences from the interfacial material.

Various well-known materials may be used to form the primer, with the proviso that they be chemically compatible with both the substrate and the gradational layer material. Among the suitable primer materials for polycarbonate substrates are thermoplastic and thermoset acrylic polymers, as described in the DeVins et al. application mentioned above.

Preferred acrylic materials for the primer are those which are ultraviolet light-curable. These materials are typically applied to the substrate as a monomer. An exemplary composition of this type comprises:

(A) at least one polyfunctional acrylate monomer represented by the general formula

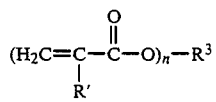

wherein n is an integer having a value of from 1 to 4, and R³ is selected from the group consisting of aliphatic hydrocarbon groups, an aliphatic hydrocarbon group containing at least one ether linkage, and a substituted aliphatic hydrocarbon group containing at least one ether linkage; and R' is selected from hydrogen or lower alkyl radicals;

(B) colloidal silica, (C) at least one acryloxy functional silane of the formula

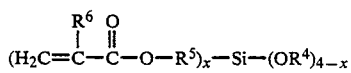

wherein R⁴ is a monovalent hydrocarbon radical, R⁵ is a divalent hydrocarbon radical, R⁶ is selected from the group consisting of hydrogen atoms and monovalent hydrocarbon radicals, x is an integer of from 1 to 4 inclusive; and (D) a photoinitiator.

After the composition is applied to the substrate, it is exposed to ultraviolet light for a period of time sufficient to polymerize and crosslink the polyfunctional acrylate monomers, thereby forming a cured coating. Ketones are useful as initiators when curing the acrylic compositions in inert atmospheres such as nitrogen, while blends of at least one ketone and at least one amine are useful as initiators when curing in oxygen-containing atmospheres, as described in R. Chung's U.S. Pat. No. 4,478,876, incorporated herein by reference.

Many of the organosilicon materials discussed above are also suitable as primers (not applied by PECVD), and in that instance, they may often have colloidal silica dispersed therein, which increases the hardness of the material. Dispersions of colloidal silica in organosilicon materials are well-known in the art, and are described, for example, in U.S. Pat. Nos. 3,986,997, 4,027,073, 4,239,798, 4,284,685, 4,436,851, all incorporated herein by reference. Typically, the colloidal silica is dispersed in an aqueous solution of the organosilicon. For example, these compounds may comprise a dispersion of colloidal silica in a lower aliphatic (e.g., less than about 6 carbon atoms) alcohol-water solution of the partial condensate of a silanol.

When used, colloidal silica should comprise about 5% to about 40% by weight of the total nonvolatile weight of the primer. Furthermore, aqueous colloidal silica dispersions used in the present invention generally have a particle size in the range of about 5 to about 150 nanometers in diameter. An especially preferred particle size range is from about 5 to about 20 nanometers in diameter.

An especially preferred colloidal silica-containing organosilicon material for use as the primer is described in B. Ashby et al.'s U.S. Pat. No. 374,674, incorporated herein by reference, and comprises:

(a) a dispersion of colloidal silica in a solution of the partial condensate of a silanol having the formula RSi- (OH)$_3$ or R$_2$Si(OH)$_2$, wherein R is selected from the group consisting of alkyl groups having about 1 to 3 carbon atoms and aryl groups having about 6 to 20 carbon atoms, wherein at least 70 weight percent of the silanol is CH$_3$Si(OH)$_3$ or CH$_3$)$_2$Si(OH)$_2$ in a mixture of an aliphatic alcohol and water, said dispersion containing from 10 to 50 percent by weight of solids, said solids consisting essentially of 10 to 70 percent by weight of the colloidal silica and 30 to 90 percent by weight of the partial condensate, and (b) an effective amount of an ultraviolet light absorbing agent comprising a compound having the formula

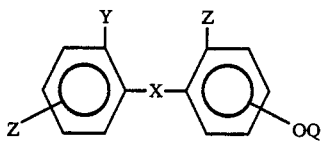

wherein:
X is

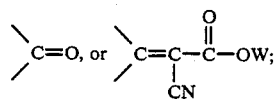

Y is H or OH;
Z is H, OH, OQ or OW, where at least one Z is OH if Y is H;
Q is —CH$_2$(CH$_2$)$_n$Si(R$^2$)$_x$(OR$^1$)$_y$; and
W is —C$_m$H$_{2m+1}$;
where x=0, 1 or 2, y=1, 2 or 3, x+y=3, and R$^1$ is an alkyl or alkanoyl group having about 1 to 6 carbon atoms, R$^2$ is an alkyl group having from about 1 to 6 carbon atoms, n=0, 1 or 2 and m=1 to 18. The composition forming this material typically contains sufficient acid to provide a pH in the range of about 3.0 to 7.0. The Ashby et al. patent also describes methods of applying and curing these coatings.

Exemplary condensates of R$_2$Si(OH)$_2$-type silanols, and compositions formed therefrom, are disclosed in U.S. Pat. No. 4,159,206 incorporated herein by reference.

Another preferred organosilicon material for use as the primer comprises a water/aliphatic alcohol dispersion of ammonium hydroxide-stabilized colloidal silica and a partial condensate derived from organotrialkoxy silanes. Such a material is described by B. Anthony in U.S. Pat. No. 4,624,870, incorporated herein by reference, and is preferably used at an alkaline pH, i.e., a pH of at least about 7.1.

Exemplary UV absorbers which may be incorporated into the primer are those of the hydroxy benzophenone and benzotriazole type, although other UV absorbers might also be used. When a UV-curable primer material is employed, latent UV absorbers which do not interfere with the curing reaction should be used. These types of UV absorbers are known in the art and are described, for example, in U.S. Pat. Nos. 4,372,835, issued to Chung et al., 4,478,876 and 4,486,504, each issued to Chung; and 4,455,205, issued to Olson et al., all incorporated herein by reference. An example of a latent UV absorber is resorcinol monobenzoate.

The amount of UV absorber depends in part on the particular composition of the acrylic, and in part on whether a UV absorber is also present in the substrate material itself. Those skilled in the art will be able to determine an appropriate quantity without undue experimentation.

Other additives which may be incorporated into the primer include anti-oxidants, fillers, reinforcing agents, wetting agents, and the like.

The gradational layer may be applied on the substrate or "over" the substrate, i.e., onto the surface of a primer coating disposed on the substrate. The application is accomplished by PECVD, which in general is a method of applying films from a gaseous discharge to a substrate. For example, the *Kirk-Othmer Encyclopedia of Chemical Technology*, Volume 10, discusses the plasma deposition of inorganic materials. Furthermore, details regarding the plasma deposition of inorganic thin films are given in *Thin Film Processes*, Ed. by Vossen and Kern, Academic Press, 1978. Exemplary plasma deposition methods are also described in U.S. Pat. Nos. 4,096,315, 4,137,365. 4,361,595, and 4,396,641. While all of the above-listed references generally describe plasma deposition, the process disclosed herein must be carried out according to the various operating parameters discussed below in order to obtain an article having excellent abrasion resistance, optical properties, and adhesion between its layers.

The following general statement regarding the operation of PECVD for the present invention applies to both the deposition of the interfacial material and the abrasion-resistant material. When a discharge is produced at low pressure in the film-forming reactants, the reactants become ionized, forming a plasma. A portion of the material is in the form of ions, electrons, and atomic free radicals generated in the plasma prior to formation of the film over or upon the substrate. Most of the reactive species consist of the atomic free radicals. Although the inventors do not wish to be bound by a specific theory, it is thought that at the higher plasma frequencies, e.g., 13.56 MHz, and at the typical gas pressures employed, e.g., 1 Torr, most of the film formation on or over the substrate occurs when the free radical species diffuse out of the plasma to the deposition surface. Thus, free radicals react on or over the primed or unprimed substrate to form the desired layer. A distinct advantage of PECVD over conventional chemical vapor deposition processes lies in the fact that the applied electric field enhances free radical formation, thereby permitting the use of deposition temperatures which are low enough to prevent damage to substrates such as polycarbonates, i.e., temperatures less than about 130° C. Furthermore, when used under the process conditions disclosed herein, PECVD can be carried out with a much higher percentage of free radicals than is possible with conventional CVD.

One PECVD system suitable for the process disclosed herein is designated as Model 2411 and sold by PlasmaTherm, Inc. However, in order to achieve the excellent results obtained by the present invention, use of this or any other PECVD apparatus must fall within the processing and compositional parameters disclosed herein.

In applying the gradational layer by PECVD, the primed or unprimed substrate is placed in a reactor chamber in which an electric field can be generated. The reactor chamber must be capable of being substantially evacuated, i.e., to a pressure of less than or equal to about 1.0 millitorr.

The method of generating and applying the electric field is not critical to this process. For example, the field may be generated by inductive coupling systems, as described, for example, by J. Vossen in *Glow Discharge Phenomena in Plasma Etching and Plasma Deposition*, J. Electrochemical Society, February 1979, pp. 319–324.

A capacitively coupled system may also be used to generate an electric field, and is preferred for use in the present invention. By this technique, which is generally described in the Vossen article referred to above, two electrodes are situated within the reaction chamber, and the plasma is formed therebetween. Each electrode may be a plate of a material that is a good electrical conductor, e.g., aluminum. The electrodes preferably each have a planar face parallel to the other electrode.

In preferred embodiments of the present process wherein the capacitively coupled system is utilized, the electrodes are horizontally arranged, i.e., an upper electrode is affixed in the upper region of the reactor chamber with a planar surface facing a planar surface of a lower electrode affixed in the lower region of the vacuum chamber. The spacing between the electrodes depends on the desired strength of the applied electric field, as well as the size of the article being coated. Those skilled in the vapor deposition art appreciate the interrelationship of these processing variables and are therefore able to make adjustments for a particular use of this invention without undue experimentation. In preferred embodiments, the substrate is positioned on the surface of the lower electrode which faces the upper electrode, such that the substrate surface to be coated is parallel to the facing surface of the upper electrode. Alternatively, the electrodes might be arranged vertically or along other geometric planes within the chamber as long as a plasma can be generated therebetween.

Film-forming materials must be in vapor or gaseous form for the PECVD process. Vapor reactants, such as acrylic, olefinic, or organosilicone monomers, are vaporized from the liquid form prior to entry into the reactor chamber. A preferred technique when sufficient vapor pressures are difficult to obtain is to introduce a mist of the liquid into the plasma region.

In preferred embodiments, the liquid material may be degassed by cooling it and then subjecting it to a vacuum. Depending on its particular boiling point, the liquid is then heated to ambient temperature or higher in order to provide sufficient positive vapor pressure to flow through a channeling system such as that described below. Alternatively, a carrier gas such as helium can be blown through the liquid to obtain a diluted vapor mixture of desired composition.

Gaseous reactants such as silane or nitrous oxide are suitable in natural form for reaction in the plasma, alone or with a carrier gas to insure proper metering into the reactor chamber. Sometimes, e.g., in the case of nitrous oxide, the reactants may be stored in liquid form beforehand.

The reactor chamber is evacuated prior to entry of the gaseous reactants. Chamber pressures as required for the process of the present invention range from about 50 millitorrs to about 10 Torrs, with a preferred pressure being in the range of about 0.3 Torr to about 1.0 Torr.

The gaseous reactants which form the composition of the gradational layer may be supplied from an external source through a series of inlet pipes into the reactor chamber. The technical particularities of channeling the various gases into the reactor chamber are well-known in the art and need not be described in detail here. For example, each gas inlet may be connected to a central feed line which carries the gases into the reactor chamber. In preferred embodiments, gaseous reactants for the abrasion-resistant composition are mixed with a carrier gas such as helium to improve the flow of the reactants into the chamber. The flow of carrier and reactant gases into the reactor may be governed by mass flow controller valves which are well-known in the art and which serve to both measure the flow of gases and to control such flow. Furthermore, the carrier gas, when used, may be premixed with the gaseous reactants or may be fed into the central feed line by a separate inlet. For example, when silane ($SiH_4$) is used as a reactant for forming silicon dioxide, it may be premixed with helium in a $SiH_4$/He volume ratio ranging from about 2:98 to 20:80. Although a carrier gas is not critical to the present invention, its use improves the uniformity of plasma density and gas pressure within the reactor chamber. Furthermore, use of the carrier gas tends to prevent gas phase particulation of the plasma-formed coating material, and also improves film quality in terms of transparency (when desired) and abrasion resistance.

Formation of the gradational layer is facilitated by the use of separate inlet pipes for reactants forming the interfacial material and for reactants forming the abrasion-resistant material. The flow of each of these gases is also controlled by the mass flow controller valves described above. Since the interfacial material is often formed from reactants which are liquids at room temperature, the material is advantageously stored in a supply vessel located in an oven to allow for the vaporization of the material prior to entry into the reactor chamber.

When using the capacitively coupled system, the gaseous reactants entering the reactor chamber from the central feed valve are passed between the upper and lower electrodes and over the substrate to be coated. The quality of the gradational coating on or over the substrate or primer depends greatly on both the flow rate of the reactants and the flow dynamics, i.e., laminar characteristics, as described below. For example, excessive flow rates would force the active, film-forming reactants past the zone above the deposition surface before they react to form the coating on the surface. Conversely, if the flow rate is too small, the film-forming reactants will quickly be depleted and thereby lead to nonuniformities in film thickness. The flow rate of interfacial material reactants may range from about 5 sccm to about 250 sccm, with about 20 sccm to about 100 sccm being preferred. For coating surfaces larger than about 10 square feet, which might require reactor chambers larger than the PlasmaTherm reactor described below, higher flow rates may be desirable, e.g., up to about 2000 sccm. As further described below, the interfacial material reactants may be passed into the reactor chamber with a carrier gas.

The individual flow rates of reactants forming the abrasion-resistant material range from about 500 sccm to about 10,000 sccm for each reactant when a carrier gas is used, and from about 5 sccm to about 2000 sccm without a carrier gas. For example, a silicon dioxide coating may advantageously be formed by flowing silane at a rate of about 10 sccm to about 100 sccm and nitrous oxide at a rate of about 300 sccm to about 5000 sccm into the reactor along with a carrier gas flowing at a constant value in the range between about 500 sccm and 5000 sccm. As in the case of the interfacial material precursor flow rates, higher abrasionresistant material precursor flow rates may be desirable for coating surfaces larger than about 10 square feet. For example, in forming silicon dioxide, silane flow rates up to about 250 sccm, nitrous oxide flow rates up to about 8000 sccm, and an increase in carrier gas flow proportional to the increase in silane flow might be used. Those of ordinary skill in the art will be able to easily select a proper flow rate for a particular substrate and coating material if the teachings herein are followed.

While gas flow, gas pressure, and plasma power may be varied within the ranges described above in order to suit the requirements of a particular end use, it may be desirable in some embodiments to maintain these three parameters as fixed values during formation of the gradational layer in order to maintain a steady plasma. Preferred embodiments also call for each gaseous reactant passing into the reactor chamber to be mixed with a carrier gas which flows at a constant rate throughout plasma deposition.

Preferred embodiments also call for the total gas flow into the reactor chamber to be a constant amount during the deposition of the gradational coating. This should not be viewed as an absolute requirement for good quality coatings, but as a more efficient means for process control.

Laminar flow of the gaseous reactants relative to the deposition surface is of great importance to the present invention because it enhances the uniformity of the coating in terms of thickness and properties such as hardness, clarity, and, for the interfacial material, adhesive and thermal expansion compensation capabilities.

"Laminar flow" as used herein is defined as smooth and steady flow, i.e., a substantially streamlined flow of gaseous reactants relative to the substrate and characterized by the absence of turbulent flow of reactant molecules. This type of gas flow is described, for example, in *Fluid Mechanics*, by F. White, McGraw-Hill Book Company, 1979, p. 305 et seq., the disclosure of which is incorporated herein by reference. As described in the *White* text, laminar flow may be generally characterized by a Reynolds value of between about 1 and 1000. In preferred embodiments of this invention, a particularly preferred Reynolds value is about 2.5. Those skilled in the art understand that small areas of turbulence may be present, but do not significantly affect the properties of the deposited coating. Furthermore, as pointed out above, the mass flow of each gas may be regulated by adjustment means to control the laminar flow characteristics of the gaseous reactants.

In preferred embodiments, the coating surface is heated to a temperature between about 100° C. and 130° C. during plasma deposition, 100° C. being the most preferred temperature. The heating can be accomplished by a variety of well-known methods. For example, the resistively-heated lower electrode upon which the substrate rests serves to provide heat to the coating surface through the substrate. In some embodiments of this invention, coating surface temperatures of 100° C. or higher increase the deposition rate of the abrasion-resistant material onto the underlying surface. Furthermore, the elevated temperature may also result in greater abrasion resistance. It should also be understood that deposition onto a coating surface maintained at between about room temperature and 100° C. is also within the scope of this process.

In preferred embodiments of this invention, the substrate surface may be cleaned by washing with an alcohol solvent such as isopropanol prior to application of the next layer. This step removes dirt contaminants, and additives such as wetting agents from the surface. The primer surface may also be washed in this manner.

After being washed, the substrate is vacuum-desiccated by well-known methods to remove any water on or in the surface region which would interfere with the adhesion of the subsequently-deposited layers. The desiccation treatment may also be used on the primer surface after it has been applied to the substrate. Desiccation temperatures range from about ambient temperature to about 120° C., with the preferred range being about 80° C. to about 90° C. Desiccation duration ranges from about 2 hours to about 16 hours, with longer times within this range compensating for lower temperatures, and vice versa.

The surface of the substrate can often be etched after placement in the reaction chamber. Etching techniques, which in general are well-known in the art, may also be used to treat the primer surface to create free radical species thereof which will later bond with the free radical species of the plasma-applied gradational material, thereby improving adhesion between these layers.

As the reactants enter the reaction chamber after the coating surface is treated as described above, an electric field is generated under preselected frequency and power conditions to ionize the gas mix, thereby forming a plasma. Methods of generating an electric field between electrodes are well-known in the art and therefore do not require an exhaustive description here. A dc field, or an ac field from 50 Hz to about 10 GHz, may be used. Power values range from between about 10 watts to 5000 watts. A particularly suitable electrical field-generating means for this process is the use of a high frequency power supply to initiate and sustain the plasma. When such a power supply is used, a preferred operating frequency is 13.56 MHz, as described, for example, in R. Kubacki's U.S. Pat. No. 4,096,315 incorporated herein by reference. The particular frequency and power values utilized will depend in part on the particular deposition requirement for the coating material. For example, when organosilicone monomers are reacting in the plasma, lower frequencies and higher electrical power values within the above-described ranges increase the polymerization rate and deposition rate of the material, especially when lower chamber pressures within the above-mentioned range are also employed.

An additional refinement, well-known in the art, which offers the potential for beneficially modifying the plasma (e.g., by increasing the ionization and providing improved spatial control of the plasma), uses separate magnetic fields in conjunction with the electric field. An example of such magnetic enhancement is "ECR" (electron cyclotron resonance) microwave plasma technique.

As mentioned above, the gradational layer may be formed by initially feeding plasma-polymerizable interfacial material precursors into the reactor, and then gradually changing the feed composition to abrasion-resistant material precursors. The change in feed composition may be accomplished by manually adjusting the flow of each gas into the central feed line. Those skilled in the art appreciate that such gas flow adjustment can also be accomplished automatically by various means. Each adjustment is made according to a prescribed time and flow rate regimen based on data obtained from the mass flow controller valves.

In preferred embodiments, the PECVD deposition of the gradational layer occurs in three stages: a first stage in which only the interfacial material precursor is fed into the reactor and plasma-polymerized; a second stage in which the interfacial precursor flow is gradually reduced while the flow of abrasion-resistant material precursors is initiated and gradually increased; and a third stage in which only the abrasion-resistant material precursors are fed into the reactor and deposited. A carrier gas is often used during each stage of the deposition. The length of each stage is determined by the desired thickness of each sublayer. The resulting gradational layer has a sublayer of interfacial material closest to the substrate, a sublayer of abrasion-resistant material farthest from the substrate, and a gradational sublayer therebetween which is characterized by a gradual transition from the interfacial material to the abrasion-resistant material. The change in feed composition may be effected linearly or nonlinearly, e.g., exponentially, from the interfacial precursor flow to the abrasion-resistant precursor flow. The examples which follow further describe this technique.

It is also within the scope of this invention that the initial gas composition flowing into the reactor contain a small amount of abrasion-resistant precursor material, e.g., about 0.1% of the total gas flow, the remainder of the composition comprising interfacial material precursors. The abrasion-resistant precursor composition is then gradually increased in proportion to the gradual decrease in the interfacial material precursor composition, resulting in a gradational layer characterized by a gradual transition from a composition consisting essentially of an interfacial material to a composition consisting essentially of an abrasion-resistant material.

The overriding consideration for feed composition adjustment is, of course, the desired characteristics of the deposited gradational layer. For example, an article requiring an especially high level of abrasion-resistance but not likely to be subjected to rapid thermal changes or wide temperature variations may be formed by decreasing the time period of interfacial material precursor flow and increasing the time period of abrasion-resistant material precursor flow. The resulting article would thus have a thicker abrasion-resistant layer than an article formed according to the regimen exemplified above.

Conversely, an article likely to be subjected to wide temperature variations may be formed by decreasing the time period of abrasion-resistant precursor flow and increasing the time period of interfacial material precursor flow to produce an article having more of its depth as interfacial material.

The thickness of the gradational layer is in part determined by the contemplated end use of the article, and generally may range from about 0.01 micron to about 5.0 microns. Similarly, the thickness of each zone or sublayer —when distinctly present—depends on the end use of the article.

After passing over the coating surface, the carrier gas and any gas reactants or products which have not been deposited on the substrate surface may be directed out of the chamber through an exit valve and then to a gas pumping and exhaust system. Means for expelling these excess materials from the chamber are well-known in the art. When the electrodes are circular and flat as described above, the exhaust manifold can be located in the center of the lower electrode. Furthermore, after the application of the gradational layer, residual gases may be removed from the reactor chamber by pumping means.

Embodiments of the present invention result in the formation of articles having a high degree of hardness and an abrasion resistance. Furthermore, when the process is utilized to form a transparent glazing material, the resulting articles are very smooth and free from microcracks Moreover, the gradational layer is capable of accommodating large differences in thermal expansion when the article is subjected to heating/cooling cycles.

EXAMPLES

The following examples are provided to more fully describe the present invention. It is intended that these examples be considered as illustrative of the invention, rather than limiting what is otherwise disclosed and claimed herein.

A brief description of the tests utilized in some or all of the following examples will now be given:

Abrasion resistance was measured by a combination of two ASTM test methods. The Taber Abrasion Test, ASTM D1044, was used with a 1,000 gram total weight load evenly distributed on the two wear wheels. 300 and/or 1,000 cycles were used, as indicated below. The second test method was ASTM D1003, which uses a Gardner Hazemeter, Model UX 10. In this method, the percentage of light scattering is measured before and after the specimen is taber-abraded. The lower the value, the better the abrasion resistance and hardness.

Optical transparency was measured on a UV-Visible Spectrometer, Model 330, manufactured by the Perkin Elmer Corporation.

Adhesion was measured by the scribed adhesion test, ASTM Test D3359, in which a 0.75 inch (1.9 cm) square of the material is cross-hatched into 2.0 mm squares. A 3M Company No. 610 adhesive tape is then pressed onto the surface of the grid pattern and removed with a swift, even pull. The amount of material remaining on the sample is indicative of the adherence characteristics of the coating to an underlying surface.

Two types of temperature cycling tests were carried out. Test A was very severe because of the large temperature excursion and very abrupt rate of temperature change (dT/dt). The thermal cycle profile consisted of two stages: first, a cool-down to $-35°$ C. (dT/dt=$22°$ C./min); hold for 90 minutes; heat up to $50°$ C. (dT/dt=$17°$ C./min); hold for 90 minutes; cool down to $20°$ C. (dT/dt=$26°$ C./min); hold for 15 minutes, and then examination of the sample; and second, cool down to $-35°$ C. (dT/dt=$22°$ C./min); hold for 90 minutes, heat up to $100°$ C. (dT/dt=$15°$ C./min); hold for 90 minutes; cool down to $20°$ C. (dT/dt=$30°$ C./min); hold for 15 minutes, and then examination of the sample.

Test B consisted of ten cycles of the following thermal cycle: cool down $-35°$ C.; hold for 120 minutes, heat up to $85°$ C., hold for 120 minutes; cool down to $-35°$ C., etc. In this case, the rate of temperature change was substantially lower than in Test A, and was held constant throughout the entire ten cycles at dT/dt=$1.41°$ C./min.

Strain to microcracking measurements were made on $4'' \times \frac{1}{2}'' \times \frac{1}{4}''$ samples. For this purpose the samples were placed in a three point bending jig attached to an Instron device. The latter bent the samples and recorded the sample deflection at the time microcracking was visually observed. The strain to microcracking, $\epsilon$, was then calculated from $\epsilon = 4 \, dlT/L^2$, where dl is the deflection at microcracking, L the length of the sample (4"), and T, its thickness (¼").

Impact strength was determined by the use of a Gardner Heavy-Duty Variable Impact Tester.

The thickness of the coating applied to the substrate by plasma deposition was controlled and determined by process conditions and processing time, as described above. Once the reactant gas mix flow rate, substrate temperature, frequency, and pressure have been set, thickness can be determined within about ±5% by simply timing the duration of the process.

The thickness uniformity of an applied coating is assessed from the interference color produced by the coating; such a method is suitable for coatings having thicknesses of about 0.3 microns. For greater coating thicknesses (from about 0.04 micron–10 microns), a profilometer (Sloan Dektak II) provides a determination of coating uniformity. Small, thin silicon wafers are positioned at strategic locations prior to deposition of the coating and then removed afterwards, exposing the steps used for measuring thickness.

Example 2

Using the processing conditions shown in Table 1, a gradational layer was deposited on bisphenol A-based polycarbonate (samples 1 and 2). The abrasion-resistant material was $SiO_2$ and the interfacial material was plasma-polymerized vinyltrimethylsilane (VTMS).

TABLE 1

(Samples 1 and 2)

| Sublayer Composition | Pre-calculated Thickness | Process Conditions (Pressure, flow rates, power) | Time of Gas Feed |
|---|---|---|---|
| $SiO_2$ | 0.7 μm | 1000 mTorr<br>1200 sccm $SiH_4$ (He)<br>800 sccm $N_2O$<br>50 watts | 20 min |
| Gradational | 0.6 μm | 1000 mTorr<br>(Composition varied linearly)<br>50 watts | 20 min |
| VTMS* | 1000 Å | 1000 mTorr<br>40 sccm VTMS<br>1960 sccm He<br>50 watts | 20 min |

*Vinyltrimethylsilane

The linear variation of composition for the gradational sublayer occurred as follows:

TABLE 2

| Time of Gas Feed (minutes) | $SiH_4$ Flow (sccm) | $N_2O$ Flow (sccm) | VTMS Flow (sccm) | He Flow (sccm) |
|---|---|---|---|---|
| 20 | 0 | 0 | 40 | 1960 |
| 22.5 | 150 | 100 | 35 | 1680 |
| 25 | 300 | 200 | 30 | 1440 |
| 27.5 | 450 | 300 | 25 | 1200 |
| 30 | 600 | 400 | 20 | 960 |
| 32.5 | 750 | 500 | 15 | 720 |
| 35 | 900 | 600 | 10 | 480 |
| 37.5 | 1050 | 700 | 5 | 240 |
| 40 | 1200 | 800 | 0 | 0 |

Based on measurements on the gradational coatings deposited onto silicon (Si) wafers at strategic locations in the reactor, it was concluded that the gradational coatings had good thickness uniformity. The coatings were also completely transparent, as demonstrated by their appearance, and also from absorption measurements made in the visible region (400–800 nm). In the UV region, below 400 nm, the measured absorption paralleled that of the polycarbonate.

Taber abrasion measurements carried out on sample 1 showed an improvement as compared to bare polycarbonate. Thus, the increase in haze after 300 cycles was 20–40%, which is essentially that of polycarbonate after 50 cycles.

The effect of temperature cycling of sample 2, using Test B as described above, is shown in Table 3 and compared with data obtained for control sample 3, a structure made by depositing $SiO_2$ onto polycarbonate dip-coated with an organosilicone primer comprising a dispersion of colloidal silica in a solution of the partial condensate of an alkyl silanol which further included a UV screening agent. The thickness of the organosilicone material after heat-curing was about 5.0 microns. The gradational structure shows a distinct improvement in the temperature cycling performance.

TABLE 3

Temperature Cycling, Test B

| Sample No. | Primer* | VTMS Sublayer | Gradational Sublayer | $SiO_2$ Sublayer | Result |
|---|---|---|---|---|---|
| | | Thickness (μm) | | | |
| 2 | — | 0.1 | 0.6 | 0.7 | No microcracks |
| 3 | 5 | — | — | 4.0 | Microcracked |

*Organosilicone

Example 2

Using the processing conditions shown in Table 4, a gradational layer formed from the same precursors as in Example 1 was deposited on bisphenol A-based polycarbonate (sample 4). The gradational layer was also applied on polycarbonate material which had first been dip-coated with an organosilicone material comprising a dispersion of colloidal silica in a solution of the partial condensate of an alkyl silanol which further included a UV screening agent (sample 5). The thickness of the organosilicone material after heat-curing was about 5.0 microns.

TABLE 4

(Samples 4 and 5)

| Sublayer Composition | Pre-calculated Thickness | Process Conditions (Pressure, flow rates, power) | Time of Gas Feed |
|---|---|---|---|
| $SiO_2$ | 2 μm | 1000 mTorr<br>2500 sccm $SiH_4$ (He)<br>1650 sccm $N_2O$<br>50 watts | 40 min |
| Gradational | 1.2 μm | 1000 mTorr<br>(Composition varied linearly)<br>50 watts | 40 min |
| VTMS* | 50 Å | 1000 mTorr<br>100 sccm VTMS<br>2400 sccm He<br>50 watts | 2 min |

*Vinyltrimethylsilane

The linear variation of composition for the gradational sublayer occurred as follows:

TABLE 5

| Time of Gas Feed | $SiH_4$ Flow (sccm) | $N_2O$ Flow (sccm) | VTMS Flow (sccm) | He Flow (sccm) |
|---|---|---|---|---|
| 2 min. | 0 | 0 | 100 | 2400 |
| 12 min. | 625 | 408 | 75 | 1800 |

TABLE 5-continued

| Time of Gas Feed | SiH₄ Flow (sccm) | N₂O Flow (sccm) | VTMS Flow (sccm) | He Flow (sccm) |
|---|---|---|---|---|
| 22 min. | 1250 | 816 | 50 | 1200 |
| 32 min. | 1875 | 1235 | 25 | 600 |
| 42 min. | 2500 | 1625 | 0 | 0 |

As in Example 1, the coatings were very uniform. Furthermore, their optical characteristics were excellent.

Supporting evidence of a gradational structure was obtained from Secondary Ion Mass Spectrometry measurements. The device used was a second generation Cameca IMS-3F ion microscope. These measurements were carried out on a gradational coating deposited on a silicon wafer simultaneously with the deposition made on samples 4 and 5. The gradational portion of the structure had a gradual decrease in the carbon content from the polycarbonate surface to the SiO₂ layer, where it was essentially zero.

Taber measurements showed that sample 4 possessed even greater abrasion resistance than sample 1. The increase in haze after 300 cycles was only 8%.

The scribed adhesion test showed 80% removal of the SiO₂ from the gradational layer. However, since the tape sticks more strongly to an SiO₂ surface than to a typical organosilicone surface, the adhesion is considered to be much better than indicated by the test.

The effect of temperature cycling on sample 5, using Test A as described above, is shown in Table 6 and compared with data obtained on structures (samples 6 and 7) made by depositing SiO₂ on polycarbonate pre-coated with the same organosilicone. Again, the gradational structure outperformed the non-gradational structures, even when the SiO₂ sublayer was quite thin (sample 7).

TABLE 6

Temperature Cycling - Test A

| | Thickness (μm) | | | Result | |
|---|---|---|---|---|---|
| Sample No. | Primer* | VTMS Sublayer | Gradational Sublayer | SiO₂ Sublayer | 1st Examination | 2nd Examination |
| 5 | 5 | 0.05 | 1.2 | 2.0 | O.K. | A few microcracks at edges |
| 6 | 5 | — | — | 2.0 | O.K. | Microcracked |
| 7 | 5 | — | — | 0.3 | O.K. | Microcracked |

*Organosilicone

Table 7 below demonstrates that the gradational layer does not affect the properties of the underlying substrate, such as impact strength. Sample 5, as mentioned above, was gradationally coated according to the present invention. Control sample 7(a) was uncoated bisphenol A-based polycarbonate. Control sample 7(b) was the same polycarbonate material dip-coated with the organosilicone used for sample 5.

TABLE 7

| | Impact Strength | | | | |
|---|---|---|---|---|---|
| | | Thickness (μm) | | | Impact |
| Sample No. | Primer* | VTMS Sublayer | Gradational Sublayer | SiO₂ Sublayer | Strength (in./lb.) |
| 5** | 5 | 0.05 | 1.2 | 2.0 | >320 |

TABLE 7-continued

| | Impact Strength | | | | |
|---|---|---|---|---|---|
| | | Thickness (μm) | | | Impact |
| Sample No. | Primer* | VTMS Sublayer | Gradational Sublayer | SiO₂ Sublayer | Strength (in./lb.) |
| 7(a) | — | — | — | — | >320 |
| 7(b) | 5 | — | — | — | >320 |

*Organosilicone
**After thermal cycling

Upon impact, cracking of the coating occurred in the immediate vicinity of the impact area, but no cracking or delamination occurred elsewhere.

Example 3

Using the processing conditions and compositions shown in Table 8, a gradational coating was deposited on bisphenol A-based polycarbonate (sample 8), and on the same polycarbonate dip-coated with an organosilicone material comprising a dispersion of colloidal silica in a solution of the partial condensate of an alkyl silanol which further included a UV screening agent (sample 9). The thickness of this organosilicone material after heat-curing was about 5.0 microns.

Samples 10 and 11 were controls. Sample 10 was formed by PECVD of SiO₂ directly onto polycarbonate. Sample 11 was formed by PECVD of SiO₂ onto polycarbonate which had been dip-coated with an organosilicone of the type described in Example 2.

TABLE 8

(Samples 8 and 9)

| Sublayer Composition | Pre-calculated Thickness | Process Conditions (Pressure, flow rates, power) | Time of Gas Feed |
|---|---|---|---|
| SiO₂ | 2.5 μm | 1000 mTorr 2500 sccm SiH₄ (He) 1625 sccm N₂O 50 watts | 48 min |
| Gradational | 1 μm | 1000 mTorr (Composition varied exponentially) 50 watts | 40 min |
| VTMS* | 50 Å | 1000 mTorr 175 sccm VTMS 2500 He 50 watts | 2 min |

*Vinyltrimethylsilane

The variation in composition for the gradational sublayer was approximately exponential and occurred as follows:

TABLE 9

| Time of Gas Feed | SiH₄ Flow | N₂O Flow | VTMS Flow | He Flow |
|---|---|---|---|---|
| 2 min. | 0 | 0 | 175 | 2400 |
| 22 min. | 625 | 408 | 130 | 1800 |
| 38 min. | 1250 | 816 | 88 | 1200 |
| 40 min. | 1875 | 1235 | 44 | 600 |
| 42 min. | 2500 | 1625 | 0 | 0 |

As in the previous examples, the coatings were very uniform, and their optical characteristics were excellent.

Results of strain-to-microcracking (ε) tests obtained on samples 8 and 9 are shown in Table 10 and compared with data obtained for control samples 10 and 11.

TABLE 10

| Sample No. | Primer* | Thickness (μm) VTMS Sublayer | Thickness (μm) Gradational Sublayer | Thickness (μm) SiO$_2$ Sublayer | Strain to microcracking ε (in/in × 10$^2$) |
|---|---|---|---|---|---|
| 8 | — | 0.05 | 1.0 | 2.5 | 0.45 |
| 9 | 5 | 0.05 | 1.0 | 2.5 | 0.47 |
| 10 | — | — | — | 2.0 | 0.33 |
| 11 | 5 | — | — | 2.0 | 0.35 |

*Organosilicone

Higher " values represent better strain-to-microcracking performance. Thus, it is readily apparent from this data that the gradational coating outperforms the other SiO$_2$-containing structures, demonstrating that a gradational coating indeed reduces the tensile stresses present at the interface with the polycarbonate.

The desirable qualities achievable through a PECVD-applied gradational coating may also be confirmed by calculations of the mechanical stresses in such coatings as compared to a non-gradational coating. For example, at a given deposition temperature, the resulting stresses in the coating and the substrate (after the structure had returned to room temperature) can be calculated by assuming known thermal expansion values and Young's modulus values for each material.

Modifications and variations of the present invention are possible in light of the above teachings. It should therefore be understood that changes may be made in the particular embodiments of the invention described which are within the full intended scope of the invention as defined by the appended claims.

What is claimed is:

1. A method for preparing an abrasion-resistant plastic article, comprising plasma-enhanced chemical vapor deposition of an abrasion-resistant gradational layer onto a plastic substrate, wherein the composition of the gradational layer changes gradually in a direction perpendicular to the substrate surface from a composition consisting essentially of an interfacial material selected from the group consisting of organosilicon, organometallic, acrylic, and polyolefin materials, to a composition consisting essentially of an abrasion-resistant material selected from the group consisting of silicon dioxide, silicon nitride, silicon oxynitride, silicon carbide, silicon carbonitride, boron oxide, boron nitride, aluminum oxide, aluminum nitride, titanium dioxide, tantalum oxide, iron oxide, germanium oxide, germanium carbide, and mixtures thereof.

2. The method of claim 1 wherein the interfacial material is formed by polymerizing an olefinic monomer in the plasma.

3. The method of claim 1 wherein the interfacial material is formed by polymerizing an acrylic monomer in the plasma.

4. The method of claim 1 wherein the interfacial material is formed by polymerizing an organosilicon monomer vapor in the plasma.

5. The method of claim 4 wherein the organosilicon monomer is selected from the group consisting of hexamethyldisilazane, hexamethyldisiloxane, vinyl trimethylsilane, and octamethylcyclotetrasiloxane.

6. The method of claim 5 wherein the abrasion-resistant material is selected from the group consisting of silicon carbide, silicon dioxide, silicon nitride, silicon oxynitride, and mixtures thereof.

7. The article produced by applying the abrasion-resistant coating of claim 1 on a plastic substrate.

8. The method of claim 1 wherein the coating is deposited onto a polycarbonate substrate.

9. The method of claim 8 wherein a primer is applied to the polycarbonate substrate prior to the plasma-enhanced chemical vapor deposition.

10. The method of claim 1 wherein the plasma-enhanced chemical vapor deposition comprises passing a feed composition of gradational layer precursors into a reactor chamber in a laminar flow relative to a substrate surface situated therein while generating an electrical field in the chamber to form a plasma of the precursors, each of which reacts in the plasma and on the underlying surface to form the gradational layer.

11. The method of claim 10 wherein the laminar flow is characterized by a Reynolds value of about 2.5.

12. The method of claim 10 wherein the deposition is carried out by:
(I) passing the interfacial material precursor into the reactor chamber for a preselected time in the absence of abrasion-resistant material precursors, followed by
(II) changing the feed composition by controlled adjustment means from the interfacial material precursor to the abrasion-resistant material precursor over a preselected time period, and then
(III) passing the abrasion-resistant material precursor into the reactor chamber in the absence of interfacial material precursors for a preselected time.

13. The method of claim 12 wherein the feed composition in step (II) is changed linearly from the interfacial material precursor to the abrasion-resistant material precursor.

14. The method of claim 12 wherein the feed composition in step (II) is changed exponentially from the interfacial material precursor to the abrasion-resistant material precursor.

15. The method of claim 12 wherein each gaseous reactant is passed into the chamber mixed with a carrier gas which flows at a constant rate throughout said plasma deposition.

16. The method of claim 15 wherein the reactor chamber pressure is maintained at a constant value throughout said deposition.

17. The method of claim 16 wherein the plasma is formed by an electrical generator operating at a constant power value and frequency.

18. The method of claim 17 wherein the reactor chamber pressure is maintained at a value between about 50 millitorrs and about 10 Torrs; and wherein the generator operates at dc or at ac frequencies of between about 50 kHz and about 10 GHz, and a power value of between about 10 watts and 5000 watts.

19. The method of claim 15 wherein the interfacial material precursor is an organosilicon compound; the abrasion-resistant material precursors are nitrous oxide and silane; and the carrier gas is helium.

20. The method of claim 19 wherein the organosilicon compound in step (I) has a flow rate ranging from about 5 sccm to about 250 sccm; the silane in step (III) has a flow rate from about 10 sccm to about 100 sccm; the nitrous oxide in step (III) has a flow rate of from about 300 sccm to about 5000 sccm; and the helium flow rate is maintained at a constant value in the range between about 500 sccm and 5000 sccm; the total gas flow in each of steps (I), (II) and (III) also being maintained at a constant value.

21. The method of claim 20 wherein the feed composition is changed exponentially from the interfacial material precursor to the abrasion resistant material precursor.

22. The method of claim 20 wherein the substrate is heated to a temperature between about room temperature and 130° C.

23. The article produced by the method of claim 22.

* * * * *

UNITED STATES PATENT AND TRADEMARK OFFICE
CERTIFICATE OF CORRECTION

PATENT NO. : 4,927,704

DATED : May 22, 1990

INVENTOR(S) : Clive W. Reed, Stefan J. Rzad and John C. Devins

It is certified that error appears in the above-identified patent and that said Letters Patent is hereby corrected as shown below:

Title page, after item 22 the following should be inserted:

--Related U.S. Application Data
[60] Continuation of Ser. No. 88,436,
August 24, 1987, abandoned.--

Column 1, the following should be inserted after the title:

--This application is a continuation of copending application Serial No. 88,436, filed August 24, 1987, now abandoned.--.

Signed and Sealed this

Twenty-sixth Day of November, 1991

Attest:

HARRY F. MANBECK, JR.

*Attesting Officer*         *Commissioner of Patents and Trademarks*